United States Patent [19]

Toyama et al.

[11] Patent Number: 5,480,762
[45] Date of Patent: Jan. 2, 1996

[54] METHOD FOR PREPARING LITHOGRAPHIC PRINTING PLATE

[75] Inventors: Tadao Toyama; Kenji Kunichika, both of Shizuoka, Japan

[73] Assignee: Fuji Photo Film Co., Ltd., Minami-ashigara, Japan

[21] Appl. No.: 796,437

[22] Filed: Nov. 22, 1991

[30] Foreign Application Priority Data

Nov. 28, 1990 [JP] Japan ................. 3-327111

[51] Int. Cl.$^6$ ................. G03F 7/30; G03F 7/32
[52] U.S. Cl. ................. 430/302; 430/278.1; 430/309; 430/331; 101/463.1; 101/467
[58] Field of Search ................. 430/309, 302, 430/331, 276, 278, 275, 158, 160, 159, 271, 950; 101/463.1, 456, 467, 457, 453

[56] References Cited

U.S. PATENT DOCUMENTS

| | | | |
|---|---|---|---|
| 4,259,434 | 3/1981 | Yamasue et al. | 430/309 |
| 4,550,073 | 10/1985 | Neiss et al. | 430/271 |
| 4,689,272 | 8/1987 | Siomon et al. | 430/302 |

FOREIGN PATENT DOCUMENTS

| | | | |
|---|---|---|---|
| 0260943 | 3/1988 | European Pat. Off. | 430/950 |
| 0347245 | 12/1989 | European Pat. Off. | |
| 0528395 | 2/1993 | European Pat. Off. | 430/950 |
| 2-40657 | 2/1990 | Japan | 430/302 |
| 1413374 | 11/1975 | United Kingdom. | |

OTHER PUBLICATIONS

Patent & Trademark Office English Language Translation of Japanese Patent 2–40657 (Feb. 1990).
World Patent Index, Feb. 9, 1990 of JP-A-2-040-657.

*Primary Examiner*—Janis L. Dote
*Attorney, Agent, or Firm*—Burns, Doane, Swecker & Mathis

[57] ABSTRACT

A method for preparing a lithographic printing plate comprises imagewise exporting a PS plate comprising an aluminum substrate having an anodized layer and a light-sensitive layer applied on one side of the substrate and then developing the PS plate with a developer comprising an aqueous solution of an alkali metal silicate, while compensating changes in the developer due to the development of the PS plate by supplementing, to the developer, a replenisher comprising an aqueous solution of an alkali metal silicate, wherein the PS plate is provided with a coating layer containing an organic polymeric compound on the back face and the replenisher is an aqueous solution of an alkali metal silicate having a ratio: $[SiO_2]/[M_2O]$ (wherein $[SiO_2]$ means molar concentration (mol/l) of $SiO_2$ and $[M_2O]$ is molar concentration (mol/l) of oxide $M_2O$ of an alkali metal (M)) ranging from 0.3 to 1.0 and an $SiO_2$ content ranging from 0.5 to 4.0% by weight. The method makes it possible to substantially reduce the amount of the developer to be replenished, does not cause any formation of insolubles even if a great deal of PS plates are processed over a long time period and thus stable developing treatment can be carried out.

11 Claims, No Drawings

METHOD FOR PREPARING LITHOGRAPHIC PRINTING PLATE

BACKGROUND OF THE INVENTION

The present invention relates to development of presensitized plates for use in making lithographic printing plates (hereinafter referred to as "PS plates"), in which aluminum plates are used as substrates, in particular to a method for developing such PS plates suitable for applying to an automatic developing machine.

A positive-working PS plate which has widely been used comprises an aluminum plate serving as a substrate provided thereon with a light-sensitive layer which comprises an o-quinonediazide compound. It is known that the o-quinonediazide compound is converted into a carboxylic acid through irradiation with ultraviolet rays. Correspondingly, if such an exposed PS plate is developed with an alkaline aqueous solution, only the exposed portion on the light-sensitive layer is removed and thus the surface of the substrate is revealed. Since the surface of the aluminum substrate is hydrophilic, the surface portion (non-image area) of the aluminum substrate revealed through the development receives water but repels oil-based inks. On the other hand, the remaining portion (image area) which has the light-sensitive layer even after the development is lipophilic and, therefore, receives inks but repels water.

There have been known a variety of alkaline aqueous solutions used for developing such imagewise exposed positive-working PS plates, but most preferred are aqueous solutions of silicates such as sodium silicate and potassium silicate. This is because, the developing ability of the solution can be adjusted to some extent by controlling the ratio of silicon oxide $SiO_2$ to alkali metal oxide $M_2O$ (in general, expressed in terms of the molar ratio, $[SiO_2]/[M_2O]$, in the silicate and the concentration thereof.

These silicates are likewise used as developers for reversal type negative-working PS plates whose light-sensitive layer comprises an o-quinonediazide compound as disclosed in Japanese Patent Publication for Opposition Purpose (hereinafter referred to as "J.P. KOKOKU") No. Sho 56-14970(= U.S. Pat. No. 4,196,003); negative-working PS plates whose light-sensitive layer comprises an alkali-soluble diazonium salt as disclosed in EP-A- 0415422; and negative-working PS plates whose light-sensitive layer comprises a resin carrying dimethylmaleimido groups on the side chains as a photocrosslinking agent as disclosed in U.S. Pat. No. 4,416, 975 and EP-A-0443,742, in addition to the foregoing positive-working PS plates.

Recently, there have widely been used automatic developing machines in the fields of plate-making . printing industries for rationalizing and standardizing the plate-making operations. The automatic developing machine in general comprises a device for conveying PS plates, a bath for developer and a spraying device and develops an exposed PS plate by pumping up a developer and spraying it on the surface of the PS plate, which is horizontally conveyed, through a spray nozzle. Alternatively, there has also been known a method in which a PS plate is conveyed through a developer contained in a bath by the action of, for instance, a guide roll immersed in the developer to thus develop the PS plate.

Japanese Unexamined Patent Publication (hereinafter referred to as "J.P. KOKAI") NO. Sho 54-62004 (=U.S. Pat. No. 4,259,434) discloses that when positive-working PS plates are treated with such an automatic developing machine, a large quantity of these positive-working PS plates can be treated without exchanging a developer in a tank over a long time period through the use of an aqueous solution of sodium silicate whose molar ratio: $SiO_2/Na_2O$ ranges from 1.0 to 1.5 (i.e., $[SiO_2]/[Na_2O]$ ranges from 1.0 to 1.5) and whose $SiO_2$ content ranges from 1 to 4% by weight and through continuous or intermittent addition, to the developer, of an aqueous solution of sodium silicate (replenisher) having a molar ratio, $SiO_2/Na_2O$ ranging from 0.5 to 1.5 (i.e., $[SiO_2]/[Na_2O]$ ranging from 0.5 to 1.5) depending on the quantity of the positive-working PS plates to be processed.

However, if a large quantity of PS plates are processed by this developing method, insolubles are formed in the developer during processing, adhere onto the processed PS plates and become a cause of clogging of nozzles and of loading of filters. It is known that the formation of such insolubles is conspicuous, in particular, in the development of positive-working PS plates in which an aluminum plate having an anodized layer is used as a substrate. In order to solve this problem, J.P. KOKOKU No. Sho 57-7427(=U.S. Pat. No. 4,259,434) discloses a method in which a developer is used which comprises an alkali metal silicate having $[SiO_2]/[M]$ ranging from 0.5 to 0.75 (i.e., $[SiO_2]/[M_2O]$ ranging from 1.0 to 1.5) and an $SiO_2$ content of 1 to 4% by weight, an alkali metal silicate used in a replenisher has $[SiO_2]/[M]$ ranging from 0.25 to 0.75 (i.e., $[SiO_2]/[M_2O]$ ranging from 0.5 to 1.5), and both developer and replenisher comprise at least 20% of potassium on the basis of the total amount (g atom) of the alkali metals present therein. This method can inhibit the formation of insolubles, but the activity of the replenisher is relatively low and this increases the amount thereof to be supplemented. The technique disclosed in J.P. KOKAI No. Hei 2- 3065(=EP-A-0347245) can eliminate this drawback, but there has still strongly been required for the reduction in the running cost and the amount of waste liquor. More specifically, there has recently been discussed, on a worldwide scale, about the conservation of natural environment and correspondingly there has been required for the reduction of the quantity of industrial waste.

SUMMARY OF THE INVENTION

Accordingly, an object of the present invention is to provide a method for preparing a lithographic printing plate which makes it possible to reduce the amount of a replenisher for development and hence the amount of industrial waste.

Another object of the present invention is to provide a method for preparing a lithographic printing plate which never causes the formation of insolubles during development even when a large quantity of PS plates are processed over a long time period and which allows stable treatment of PS plates.

The inventors of this invention have conducted various studies to achieve the foregoing objects, have found out that a great deal of anodized layer on an aluminum substrate of a PS plate is dissolved out from the surface (hereinafter referred to as "back face") opposite to that carrying a light-sensitive layer and that this becomes a cause of the formation of insolubles and have completed the present invention based on this finding.

According to the present invention, the foregoing objects can be achieved by providing a method for preparing a lithographic printing plate which comprises imagewise exposing to light a PS plate comprising an aluminum substrate having an anodized layer and a light-sensitive layer applied on one side of the substrate and then developing the imagewise exposed PS plate with a developer comprising an aqueous solution of an alkali metal silicate, while compensating changes in the developer due to development by supplementing, to the developer, a replenisher comprising an aqueous solution of an alkali metal silicate, wherein the PS plate is provided with a coating layer comprising a light- and/or heat-hardened organic polymeric compound on the back face and the replenisher is an aqueous solution of an alkali metal silicate having a ratio: $[SiO_2]/[M_2O]$ (wherein $[SiO_2]$ means molar concentration (mol/l) of $SiO_2$ and $[M_2O]$ is molar concentration (mol/l) of an alkali metal (M) oxide $M_2O$) ranging from 0.3 to 1.0 and an $SiO_2$ content ranging from 0.5 to 4.0% by weight.

DESCRIPTION OF THE PREFERRED EMBODIMENTS

PS plates to which the method of the present invention is applied basically comprise aluminum plates having anodized layers. Examples of preferred aluminum substrates are pure aluminum plate, aluminum alloy plates and plastic films on which aluminum layers are deposited. These aluminum plates are subjected to anodization to form an anodized layer thereon, but it may be grained prior to the anodization. The anodized aluminum plate is preferably treated by immersing it in an aqueous solution of alkali metal silicate as disclosed in J.P. KOKOKU No. Sho 47-5125 (=U.S. Pat. No. 3,181,461).

The foregoing anodization treatment is performed by passing an electric current through an aluminum plate serving as an anode in an electrolyte selected from the group consisting of aqueous or non-aqueous solutions containing inorganic acids such as phosphoric acid, chromic acid, sulfuric acid and boric acid, or organic acids such as oxalic acid and sulfamic acid or salts thereof, or a mixture of these aqueous and non-aqueous solutions. It is also effective to subject an aluminum plate through silicate electrodeposition as disclosed in U.S. Pat. No. 3,658,662.

Useful substrate further include those anodized after electrolytic graining as disclosed in U.S. Pat. No. 4,087,341, J.P. KOKOKU No. Sho 46-27481 and J.P. KOKAI No. Sho 52-30503. Preferred aluminum substrates are likewise prepared by graining an aluminum plate, then chemically etching and anodizing as disclosed in U.S. Pat. No. 3,834,998. These hydrophilization treatments are performed for a variety of purposes. More specifically, it is performed not only for making the surface of the substrate hydrophilic, but also for preventing the occurrence of any detrimental reaction thereof with a light-sensitive composition subsequently applied thereto and for enhancing the adhesion thereof to the light-sensitive layer.

A coating layer (hereinafter referred to as "back coat layer") of an organic polymeric compound is applied onto the back face of the substrate used in the PS plate treated by the method of this invention in order to prevent the dissolution of the anodized layer of the aluminum substrate. The back coat layer is preferably formed from organic polymeric compounds insoluble in alkaline silicate developers such as polyethylene, polypropylene, polybutene, polybutadiene, polyamide, polyurethane, polyurea, polyimide, polysiloxane, polycarbonate, epoxy resin, condensed alkylphenol/aldehyde resin, acetal resin, polyvinyl chloride, polyvinylidene chloride, polystyrene, acrylic resin and copolymer resins thereof.

The back coat layer of the organic polymeric compound may optionally comprises, in addition to these organic polymeric compounds, plasticizers for imparting flexibility to the layer. Examples of preferred plasticizers are phthalic acid esters such as dimethyl phthalate, diethyl phthalate, dibutyl phthalate, diisobutylphthalate, diocyl phthalate, octyl capryl phthalate, dicyclohexyl phthalate, ditridecyl phthalate, butyl benzyl phthalate, diisodecyl phthalate and diaryl phthalate; glycol esters such as dimethyl glycol phthalate, ethyl phthalylethyl glycolate, methyl phthalylethyl glycolate, butyl phthalylbutyl glycolate and triethylene glycol caprylic acid diester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetate and butyl laurate, which may be used alone or in combination.

The amount of the plasticizers is in general up to about 30% by weight on the basis of the total weight of the resin used in the back coat layer.

Further, the back coat layer obtained by applying a photo- and/or heat-hardening composition to the back face of the substrate and hardening the composition is particularly preferred because it is highly resistant to an alkali developer. Examples of such photo- and/or heat-hardening compositions include photo-polymerizable compositions, diazo resin-containing compositions, photo-sensitive azide compound-containing compositions, photo-crosslinkable compositions, heat-polymerizable compositions and heat-crosslinkable compositions.

(a) Photo-polymerizable compositions

A photo-polymerizable composition used in this invention comprises a high-polymer binder, an unsaturated monomer having at least one addition-polymerizable unsaturated bond and a photo-polymerization-initiator.

Binders for photo-polymerizable compositions include polyvinyl butyral, polyvinyl acetate, polyvinyl pyrrolidone, gelatin, coumarone-indene resin and silicone resin rubber as disclosed in J.P.KOKOKU No. Sho 38-9663; vinylidene chloride copolymer, cellulose ether, synthetic rubber, polyvinyl acetate copolymer, polyacrylate and polyvinyl chloride as disclosed in J.P.KOKAI No. Sho 47-7728; chlorinated polyolefin as disclosed in J.P.KOKAI No. Sho 49-123021.

Unsaturated monomers are those having at least one addition-polymerizable unsaturated bond, such as (meth)acrylic esters, (meth)acrylamides, allyl compounds, vinyl ethers, vinyl esters, N-vinyl compounds, styrenes and crotonic acid esters.

Specific examples of compounds having one addition-polymerizable unsaturated bond include (meth)acrylic esters such as ethyl (meth)acrylate, propyl (meth)acrylate, butyl (meth)acrylate, amyl (meth)acrylate, ethylhexyl (meth)acrylate, octyl (meth)acrylate, t-octyl (meth)acrylate, chloroethyl (meth) acrylate, hydroxyethyl (meth)acrylate, hydroxypropyl (meth) acrylate, 2,2-dimethylhydroxypropyl (meth)acrylate, 5-hydroxypentyl (meth)acrylate, diethyleneglycol (meth)acrylate, trimethylolpropane mono(meth)acrylate, pentaerythritol mono(meth)acrylate, glycidyl (meth)acrylate, benzyl (meth) acrylate, methoxybenzyl (meth)acrylate, furfuryl (meth) acrylate, tetrahydrofurfuryl (meth)acrylate and aryl (meth) acrylate; (meth)acrylamides such as (meth)acrylamide, N-alkyl (meth)acrylamide (the alkyl is methyl, ethyl, propyl, butyl, t-butyl, heptyl, octyl, cyclohexyl, benzyl, hydroxymethyl, hydroxyethyl, etc.), N-aryl (meth)acrylamide (the aryl is phenyl, tolyl, nitrophenyl, naphthyl, hydroxyphenyl, etc.), N,N-dialkyl (meth)acrylamide (the alkyl is methyl, ethyl, propyl, butyl, isobutyl, ethylhexyl, cyclohexyl, etc.), N,N-diaryl (meth)acrylamide (the aryl is phenyl, etc.), N-methyl-N-phenyl (meth)acrylamide, N-hydroxyethyl-N-methyl (meth) acrylamide, N-2-acetamidoethyl-N-acetyl acrylamide; allyl compounds such as allyl esters such as allyl acetate, allyl caproate, allyl caprate, allyl laurate, allyl palmitate, allyl stearate, allyl benzoate, allyl acetoacetate and allyl lactate and allyloxyethanol; vinyl ethers such as alkyl vinyl ethers such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethyleneglycol vinyl ether, dimethylaminoethyl vinyl ether, diethylaminonethyl vinyl ether, butylaminoethyl vinyl ether, benzyl vinyl ether and tetrahydrofurfuryl vinyl ether, and vinyl aryl ethers such as vinyl phenyl ether, vinyl tolyl ether, vinyl chlorophenyl ether, vinyl 2,4-dichlorophenyl ether, vinyl naphthyl ether and vinyl anthranyl ether; vinyl esters such as vinyl butyrate, vinyl isobutyrate, vinyl trimethyl acetate, vinyl diethyl acetate, vinyl valerate, vinylcaproate, vinyl chloroacetate, vinyl dichloroacetate, vinyl methoxy acetate, vinyl butoxy acetate, vinyl phenyl acetate, vinyl acetoacetate, vinyl lactate, vinylβ-phenyl butyrate, vinyl cyclohexylcarboxylate, vinyl benzoate, vinyl salicylate, vinyl chlorosalicylate, vinyl tetrachlorosalicylate and vinyl naphthoate; N-vinyl compounds such as N-vinyl oxazolidone, N-vinyl imidazole, N-vinyl pyrrolidone, N-vinyl carbazole and N-vinyl ethylacetamide; styrenes such as styrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene, alkoxystyrenes (e.g., methoxystyrene, 4-methoxy-3-methylstyrene and dimethoxystyrene), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), carboxystyrenes (e.g., vinylbenzoic acid and methyl vinylbenzoate; crotonic acid esters such as alkyl crotonates such as butyl crotonate, hexyl crotonate and glycerin monocrotonate.

Examples of compounds having two or more addition-polymerizable unsaturated bonds which are more preferably used in the invention than those having only one addition-polymerizable unsaturated bond include acrylic acid esters and methacrylic acid esters such as polyacrylates and polymethacrylates of polyalcohols (herein "poly" means "di- or more" acrylates or methacrylates). Examples of polyalcohols include polyethylene glycol, polypropyleneoxide, polybutyleneoxide, polycyclohexeneoxide, polyethyleneoxidepropyleneoxide, polystyreneoxide, polyoxethane, polytetrahydrofuran, cyclohexanediol, xylylenediol, di-(β-hydroxyethoxy)benzene, glycerin, diglycerin, neopentylglycol, trimethylolpropane, triethylolpropane, pentaerythritol, dipentaerythritol, sorbitan, sorbitol, butanediol, butanetriol, 2-butene-1,4-diol, 2-n-butyl-2-ethyl-propanediol, 2-butyn-1,4-diol, 3-chloro-1,2-propanediol, 1,4-cyclohexanedimethanol, 3-cyclohexene-1,1-dimethanol, decalin diol, 2,3-dibromo-2-butene- 1,4-diol, 2,2-diethyl-1,3-propanediol, 1,5-dihydroxy-1,2,3,4-tetrahydronaphthalene, 2,5-dimethyl-2,5-hexanediol, 2,2-dimethyl- 1,3-propanediol, 2,2-diphenyl-1,3-propanediol, dodecanediol, mesoerythritol, 2-ethyl-1,3-hexanediol, 2-ethyl-2-hydroxymethyl- 1,3-propanediol, 2-ethyl-2-methyl-1,3-propanediol, heptanediol, hexanediol, 3-hexene-2,5-diol, hydroxybenzyl alcohol, hydroxyethyl resorcinol, 2-methyl-1,4-butanediol, 2-methyl-2,4-pentanediol, nonanediol, octanediol, pentanediol, 1-phenyl-1,2-ethanediol, propanediol, 2,2,4,4-tetramethyl-1,3-cyclobutanediol, 2,3,5,6-tetramethyl-p-xylene-α,α'-diol, 1,1,4,4-tetraphenyl-1,4-butanediol, 1,1,4,4-tetraphenyl-2-butyn- 1,4-diol, 1,2,6-trihydroxyhexane, 1,1'-bi-2-naphthol, dihydroxynaphthalene, 1,1'-methylene-di-2-naphthol, 1,2,4-benzenetriol, biphenol, 2,2'-bis(4-hydroxyphenyl)butane, 1,1-bis(4-hydroxyphenyl)cyclohexane, bis(hydroxyphenyl)methane, catechol, 4-chlororesorcinol, 3,4-dihydroxyhydrocinnamic acid, hydroquinone, hydroxybenzylalcohol, methylhydroquinone, methyl- 2,4,6-trihydroxybenzoate, phloroglucinol, pyrogallol, resorcinol, glucose, α-(1-aminoethyl)-p-hydroxybenzylalcohol, 2-amino-2-ethyl-1,3-propanediol, 3-amino- 1,2-propanediol, N-(3-aminopropyl)-diethanolamine, N,N'-bis-(2-hydroxyethyl)piperazine, 2,2-bis(hydroxymethyl)-2,2',2"-nitrilotriethanol, 2,2-bis(hydroxymethyl)propionic acid, 1,3-bis(hydroxyethyl)urea, 1,2-bis(4-pyridyl)-1,2-ethanediol, N-n-butyl diethanolamine, diethanolamine, N-ethyl diethanolamine, 3-mercapto-1,2-propanediol, 3-piperidino-1,2-propanediol, 2-(2-pyridyl)- 1,3-propanediol, triethanolamine, α-(1-aminoethyl)-p-hydroxybenzylalcohol and 3-amino-4-hydroxyphenyl sulfone. Among these acrylates and methacrylates, preferred are, because of the availability, ethyleneglycol diacrylate, diethyleneglycol dimethacrylate, polyethyleneglycol diacrylate, pentaerythritol triacrylate, pentaerythritol dimethacrylate, dipentaerythritol pentaacrylate, glycerin triacrylate, diglycerin dimethacrylate, 1,3-propanediol diacrylate, 1,2,4-butanetriol trimethacrylate, 1,4-cyclohexanediol diacrylate, 1,5-pentanediol diacrylate, neopentylglycol diacrylate and ethyleneoxide adducts of trimethylolpropane triacrylate.

Acrylamides and methacrylamides include methylene-bisacrylamide and methylene-bismethacrylamide as well as polyacrylamides and polymethacrylamides of ethylenediamine, diaminopropane, diaminobutane, pentamethylenediamine, hexamethylene bis(2-aminopropyl)amine, diethylenetriamine, heptamethylenediamine, octamethylenediamine, polyamines interrupted by heteroatoms and polyamines having ring (e.g., phenylenediamine, xylylenediamine, β-(4-aminophenyl) ethylamine, diamino benzoic acid, diaminotoluene, diaminoanthraquinone and diaminofluorene).

Allyl compounds include diallyl esters of dicarboxylic acid such as phthalic acid, terephthalic acid, sebacic acid, adipic acid, glutaric acid, malonic acid and oxalic acid; and diallyl esters and diallyl amides of anthraquinone disulfonic acid, benzene disulfonic acid, 2,5-dihydroxy-p-benzene disulfonic acid, dihydroxynaphthalene disulfonic acid and naphthalene disulfonic acid.

Vinyl ethers include polyvinyl ethers of the above mentioned polyalcohols such as ethylene glycol divinyl ether, 1,3,5-tri-β-vinyloxyethoxybenzene and glycerol trivinyl ether.

Vinyl esters include divinyl succinate, divinyl adipate, divinyl phthalate, divinyl terephthalate, divinylbenzene-1,3-disulfonate and divinylbutane-1,4-disulfonate.

Styrenes include divinylbenzene, p-allyl styrene and p-isopropyl styrene.

There may also be used in the invention those having two or more different addition-polymerizable unsaturated bonds such as N-β-hydroxyethyl-β-(methacrylamide)ethyl acrylate, N,N-bis(β-methacryloxyethyl)acrylamide and allyl methacrylate.

The monomer having addition-polymerizable unsaturated bond may be used alone or in combination. The monomer is used in an amount of 10 to 500 parts by weight, preferably 30 to 200 parts by weight per 100 parts by weight of the polymeric substance for a binder.

Photopolymerization initiators used in the present invention are those conventionally used and include carbonyl compounds, organic sulfur compounds, peroxides, redox system compounds, azo and diazo compounds, halogen compounds and light-reducing dyes as disclosed in J. Kosar, "Light-sensitive systems", Section 5. Examples include carbonyl compounds such as benzoin, benzoin methyl ether, benzophenone, anthraquinone, 9,10-anthraquinone, 2-methyl-anthraquinone, 2-t-butylanthraquinone, 9,10-phenanthrenequinone, diacetyl, benzyl and the compounds of the formula:

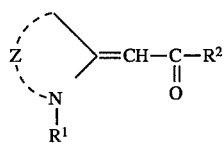

wherein $R^1$ represents an alkyl group known in cyanine dyes, such as lower alkyl such as methyl, ethyl and propyl, hydroxyalkyl such as 2-hydroxyethyl, alkoxyalkyl such as 2-methoxyethyl, carboxyalkyl such as carboxymethyl and 2-carboxyethyl, sulfoalkyl such as 2-sulfoethyl and 3-sulfopropyl, aralkyl such as benzyl, phenethyl, p-sulfophenethyl and p-carboxyphenethyl, or vinyl methyl; $R^2$ represents alkyl (e.g., preferably lower alkyl such as methyl, ethyl and propyl), aryl (e.g., preferably phenyl, p-hydroxyphenyl, p-methoxyphenyl, p-chlorophenyl and naphtyl) or thienyl; z represents a non-metallic atom group necessary for forming a hetero nucleus containing a nitrogen atom used in conventional cyanine dyes, such as benzothiazoles (e.g., benzothiazole, 5-chlorobenzothiazole, 6-chlorobenzothiazcle, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole, 5,6-dimethoxybenzothiazole), naphthothiazoles (e.g., α-naphthothiazole and β-naphthothiazole), benzoselenazoles (e.g., benzoselenazole, 5-chlorobenzoselenazole and 6-methylbenzoselenazole and 6-methoxybenzoselenazole), naphthoselenazoles (e.g., α-naphthoselenazole and β-naphthoselenazole), benzoxazoles (e.g., benzoxazole, 5-methylbenzoxazole, 5-phenylbenzoxazole and 6-methoxybenzoxazole) and naphthoxazoles (e.g., α-naphthoxazole and β-naphthoxazole).

Examples of the compounds of the above formula include 2-benzoylmethylene-3-methyl-β-naphthothiazoline, 2-benzoylmethylene-3-ethyl-β-naphthothiazoline, 3-ethyl-2-(2-thenoyl)methylene-β-naphthothiazoline, 3-ethyl-2-propionylmethylene-β-naphthothiazoline and 5-chloro-3-ethyl-2-p-methoxybenzoylmethylene-benzothiazoline.

Examples of organic sulfur compounds include di-n-butyl disulfide, di-n-octyl disulfide, dibenzyl disulfide, diphenyl disulfide, dibenzoyl disulfide, diacetyl disulfide, 2-mercaptobenzothiaizole, 2-mercaptobenzoxazole, 2-mercaptobenzimidazole, thiophenol, thiocresol, p-methoxybenzenethiol and carboxymethyl-N,N-dimethyldithiocarbamate.

Peroxides include hydrogen peroxide, di-t-butyl peroxide, benzoyl peroxide and methyl ethyl ketone peroxide.

Redox system compounds are combinations of peroxides and reducing agents such as combinations of ferrous ion with hydrogen peroxide, ferrous ion with persulfate ion and ferric ion with peroxide.

Azo and diazo compounds include α,α'-azobisisobutyronitrile, 2-azobis-2-methylbutyronitrile, 1-azobiscyclohexanecarbonitrile, diazonium salts of p-aminodiphenylamine and compounds containing trichloromethyl or tribromomethyl group.

Photo-reducing dyes include Rose Bengal, erythrosine, eosine, acriflavine, riboflavin and thionine.

The photopolymerization initiators are used in an amount of 0.1 to 20, preferably 1 to 10 parts by weight per 100 parts by weight of the monomer.

The photo-polymerizable composition used in the invention comprises the above components and optionally may contain a heat polymerization inhibitor. Examples of the inhibitors include paramethoxyphenol, hydroquinone, alkyl or aryl substituted hydroquinone, t-butylcatechol, pyrogallol, cuprous chloride, phenothiazine, chloranil, naphthylamine, α-naphthol, 2,6-di-t-butyl-p-cresol, pyridine, nitrobenzene, dinitrobenzene, p-toluidine and methylene blue-copper salt of organic acid (e.g., copper acetate).

The heat polymerization inhibitors are preferably used in an amount of 0.001 to 5 parts by weight per 100 parts of the monomer.

The photo-polymerizable composition used in the invention may further contain various additives such as colorants, plasticizers and resins. Colorants include pigments such as titanium oxide, carbon black, iron oxide, phthalocyanine pigments and azo pigments, and dyes such as Methylene Blue, Crystal Violet, Rhodamine B, Fuchsine, Auramine, azo dyes and anthraquinone dyes. Preferred are those which do not absorb the light of wavelength which the photopolymerization initiator used absorbs. Preferably, the colorants are used in an amount of 0.1 to 30 parts by weight for pigments, or 0.01 to 10, preferably 0.1 to 3 parts by weight for dyes per 100 parts by weight of the total of the binder and the monomer.

Examples of plasticizers are phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate and diaryl phthalate; glycol esters such as dimethyl glycol phthalate, ethyl phthalylethyl glycolate, methyl phthalylethyl glycolate, butyl phthalylbutyl glycolate and triethylene glycol caprylic acid diester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; triethyl citrate, glycerin triacetate and butyl laurate.

(b) Compositions comprising diazo resins

There may be used diazo resins whose typical example is a condensate of p-diazodiphenylamine and paraformaldehyde and which may be water-soluble or water-insoluble. Preferred are those which are water-insoluble but soluble in a conventional organic solvent. Particularly preferred diazo resins are those having two or more diazo groups in a molecule such as salts of a condensate of p-diazodiphenylamine and formaldehyde or acetaldehyde with phenol, fluorocapric acid, or sulfonic acid such as triisopropylnaphthalene sulfonic acid, 4,4-biphenyldisulfonic acid, 5-nitro-o-toluenesulfonic acid, 5-sulfo-salicylic acid, 2,5-dimethylbenzenesulfonic acid, 2-nitrobenzenesulfonic acid, 3-chlorobenzene-sulfonic acid, 3-bromobenzenesulfonic acid, 2-chloro-5-nitrobenzene-sulfonic acid, 2-fluorocaprylnaphthalene-sulfonic acid, 1-naphthol-5-sulfonic acid, 2-methoxy-4-hydroxy-5-benzoyl-benzenesulfonic acid and p-toluenesulfonic acid. Other preferred diazo resins include salts of a condensate of 2,5-dimethoxy-4-p-tolylmercaptobenzene diazonium and formaldehyde and a condensate of 2,5-dimethoxy-4-morpholinobenzene diazonium and formaldehyde or acetaldehyde with the above mentioned acids. The diazo resins disclosed in U.K.Patent No. 1,312,925 are also preferred.

The diazo resins can be used alone to prepare a light-sensitive composition for a resist but preferably is used together with a binder.

Examples of such binders include various high molecular compounds and preferably those having such a group as hydroxy, amino, carboxyl, amide, sulfonamide, active methylene, thioalcohol and epoxy. Preferred binders include shellac disclosed in U.K.Patent No. 1,350,521; polymers having as a main repeating unit hydroxyethyl acrylate or hydroxyethyl methacrylate units as disclosed in U.K.Patent No. 1,460,978 and U.S. Pat. No. 4,123,276; polyamide resins as disclosed in U.S. Pat. No. 3,751,257; phenol resins and polyvinyl acetal resins such as polyvinyl formal resins and polyvinyl butyral resins as disclosed in U.K.Patent No. 1,074,392; linear polyurethane resins as disclosed in U.S. Pat. No. 3,660,097; phthalated resins of polyvinylalcohol, epoxy resins obtained by a condensation of bisphenol A and epichlorohydrin; polymers having amino groups such as polyaminostyrene and polyalkylamino (meth)acrylate; celluloses such as cellulose acetate, cellulose alkyl ether and cellulose acetate phthalate.

The binder is contained in the light-sensitive resist forming composition preferably in an amount of 40 to 95% by weight. As the amount of the binder increases, i.e., as the amount of the diazo resin decreases, light-sensitivity increases but stability with time decreases. The optimum amount of the binder is about 70 to 90% by weight.

The composition comprising the diazo resin may further contain such additives as phosphoric acid, dyes and pigments as disclosed in U.S. Pat. No. 3,236,646.

(c) Compositions comprising photo-sensitive azide compounds

Preferable azide compounds are aromatic azide compounds having an aromatic ring to which azide group is linked directly or through carbonyl or sulfonyl group. The azide group of these compounds is photolytically degraded to form a nitrene which undergoes various reactions to make the compound insoluble. Examples of preferred, aromatic azide compounds are those having one or more groups such as azidophenyl, azidostyryl, azidobenzal, azidobenzoyl and azidocinnamoyl, for example, 4,4'-diazidochalcone, 4-azido-4'-(4-azidobenzoylethoxy)chalcone, N,N-bis-p-azidobenzal-p-phenylenediamine, 1,2,6-tri(4'-azidobenzoquinone)hexane, 2-azido-3-chlorobenzoquinone, 2,4-diazido-4'-ethoxyazobenzene, 2,6-di(4'-azidobenzal)-4-methylcyclohexanone, 4,4'-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4'-azidobenzal) cyclohexanone, 4,4'-azidodiphenylmethane, 1-(4-azidophenyl) 5-furyl-2-penta-2,4-idiene-1-one, 1-(4-azidophenyl)-5-( 4-methoxyphenyl)-penta-1,4-diene-3-one, 1-(4-azidophenyl)-3-( 1-naphthyl)propene-1-one, 1-(4-azidophenyl)-3-( 4-dimethylaminophenyl)-propane-1-one, 1-(4-azidophenyl)-5-phenyl- 1,4-pentadiene-3-one, 1-(4-azidophenyl)-3-(4-nitrophenyl)- 2-propene-1-one, 1-(4-azidophenyl)-3-(2-furyl)-2-propene-1-one, 1,2,6-tri(4'-azidobenzoxy)hexane, 2,6-bis-(4-azidobenzylidine-p-t-butyl)cyclohexane, 4,4'-diazidodibenzalacetone, 4,4'-diazidostilbene- 2,2'-disulfonic acid, 4'-azidobenzalacetophenone-2-sulfonic acid, 4,4'-diazidostilbene-α-carboxylic acid, di-(4-azido-2'-hydroxybenzal)acetone-2-sulfonic acid, 4-azidobenzalacetophenone-2-sulfonic acid, 2-azido- 1,4-dibenzenesulfonylamino naphthalene and 4,4'-diazidostilbene- 2,2'-disulfonic acid anilide.

In addition to the above mentioned low molecular aromatic azide compounds, there may be suitably used azide group-containing polymers as disclosed in J.P.KOKOKU Nos. Sho 44-9047, 44-31837, 45-9613, 45-24915 and 45-25713; J.P.KOKAI Nos. Sho 50-5102, 50-84302, 50-84303 and 53-12984.

The photo-sensitive azide compounds are preferably used together with high molecular compounds as binders. Preferred binders include alkali-soluble resins, for example, natural resins such as shellac and rosins; novolak phenol resins such as phenol-formaldehyde resins and m-cresol-formaldehyde resins; homopolymers of unsaturated carboxylic acid and copolymers with other copolymerizable monomers such as polyacrylic acids, polymethacrylic acids, methacrylic acid-styrene copolymers, methacrylic acid-methyl acrylate copolymers and styrene-maleic anhydride copolymers; partial acetal resins of partially or fully saponified polyvinylacetate with aldehydes such as acetaldehyde, benzaldehyde, hydroxybenzaldehyde and carboxybenzaldehyde; and polyhydroxystyrenes. Moreover, one can use as a binder organic solvent-soluble resins including cellulose alkyl ethers such as cellulose methyl ethers and cellulose ethyl ethers.

The binder is contained in the composition comprising the photo-sensitive azide compound preferably in an amount of about 10 to about 90% by weight based on the total weight of the composition.

The composition comprising the photo-sensitive azide compound may contain additives such as dyes or pigments; plasticizers such as phthalic acid esters, phosphoric acid esters, aliphatic carboxylic acid esters, glycols and sulfonamides; and sensitizing agents such as Michler's ketone, 9-fluorenone, 1-nitropyrene, 1,8-dinitropyrene, 2-chloro-1, 2-benzanthraquinone, 2-bromo-1,2-benzanthraquinone, pyrene-1,6-quinone, 2-chloro-1,8-phthaloyl naphthalene and cyanoacridine.

(d) Compositions comprising high molecular compounds having —CH=CH—CO— groups in the main chain or side chain thereof Examples include those comprising as a main component a light-sensitive polymer such as polyesters, polyamides or polycarbonates which comprise —CH=CH—CO— groups as disclosed in U.S. Pat. Nos. 3,030,208, 3,707,373 and 3,453,237; those comprising as a main component a light-sensitive polyester derived from (2-propenylidene)-malonic acid derivatives such as cinnamylidenemalonic acid and a bifunctional glycol as disclosed in U.S. Pat. Nos. 2,956,878 and 3,173,787; those comprising as a main component a cinnamic acid ester of a hydroxy-containing polymer such as polyvinyl alcohol, starch, cellulose and similar compounds as disclosed in U.S. Pat. Nos. 2,690,966, 2,7523,372 and 2,732,301. These compositions may contain sensitizing agents, stabilizers, plasticizers, pigments, dyes or the like.

(e) Heat polymerizable and heat crosslinkable compositions

Heat polymerizable compositions include those comprising the above-mentioned light-polymerizable composition and a heat-polymerization initiator such as peroxide; and those comprising a heat decomposable or heat crosslinkable azide compound. These compositions can be hardened by heat, light or both.

Further, heat hardening compositions comprising isocyanate compound or epoxy compound may be used in the invention.

The back coat layer may further comprise a surfactant for improving, for instance, slipping properties, appearance of the coated surface and adhesion to substrates. Preferred surfactants are anionic, cationic, non-ionic and amphomeric ones.

Examples of preferred surfactants are nonionic surfactants such as polyoxyethylene alkyl ethers, polyoxyethylene alkylphenyl ethers, polyoxyethylene polystyrylphenyl ethers, polyoxyethylene polyoxypropylene alkyl ethers, glycerin partially esterified with fatty acids, sorbitan partially esterified with fatty acids, pentaerythritol partially esterified with fatty acids, propylene glycol fatty acid monoesters, sucrose partially esterified with fatty acids, polyoxyethylene sorbitan partially esterified with fatty acids, polyoxyethylene sorbitol partially esterified with fatty acids, polyethylene glycol fatty acid esters, polyglycerin partially esterified with fatty acids, castor oil modified with polyoxyethylene, polyoxyethylene glycerin partially esterified with fatty acids, fatty acid diethanolamides, N,N-bis-2-hydroxyalkylamines, polyoxyethylene alkylamines, triethanolamine fatty acid esters and trialkylamine oxide; anionic surfactants such as fatty acid salts, abietic acid salts, hydroxyalkanesulfonic acid salts, alkanesulfonic acid salts, dialkylsulfosuccinic acid ester salts, linear alkylbenzenesulfonic acid salts, branched alkylbenzenesulfonic acid salts, alkylnaphthalene-sulfonic acid salts, alkylphenoxy polyoxyethylenepropylsulfonic acid salts, polyoxyethylene alkylsulfophenyl ether salts, sodium salt of N-methyl-N-oleyltaurine, disodium salts of N-alkylsulfosuccinic acid monoamides, petroleumsulfonic acid salts, sulfated castor oil, sulfated tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphoric acid ester salts, polyoxyethylene alkyl ether phosphoric acid ester salts, polyoxyethylene alkyl phenyl ether phosphoric acid ester salts, partially saponified styrene-maleic anhydride copolymers, partially saponified olefin-maleic anhydride copolymers and condensates of naphthalenesulfonate-formalin; cationic surfactants such as alkylamine salts, quaternary ammonium salts, polyoxyethylene alkylamine salts and polyethylene polyamine derivatives; and amphoteric surfactants such as carboxy betaines, aminocarboxylic acids, sulfobetaines, aminosulfuric acid esters and imidazolines. In the foregoing surfactants carrying polyoxyethylene moieties, the polyoxyethylene moiety can be substituted with other polyoxyalkylene such as polyoxymethylene, polyoxypropylene and polyoxybutylene and such surfactants can likewise be used in the back coat layer.

In addition, preferred surfactants also include fluorine atom-containing surfactants having a perfluoroalkyl group in the molecule. Examples thereof include anionic ones such as perfluoroalkylcarboxylic acid salts, perfluoroalkylsulfonic acid salts and perfluoroalkylphosphoric acid esters; amphoteric ones such as perfluoroalkyl betaines; cationic ones such as perfluoroalkyl trimethyl ammonium salts; and nonionic ones such as perfluoroalkylamine oxides, perfluoroalkyl ethylene oxide adducts, oligomers containing perfluoroalkyl and hydrophilic groups, oligomers containing perfluoroalkyl and lipophilic groups, oligomers containing perfluoroalkyl, hydrophilic and lipophilic groups and urethanes containing perfluoroalkyl and lipophilic groups.

The foregoing surfactants are used alone or in any combination and the amount thereof to be incorporated into the back coat layer ranges from 0.001% by weight to about 10% by weight of the back coat layer, preferably 0.01 to 1% by weight of the back coat layer.

The back coat layer used in the invention must have a thickness sufficient to prevent the dissolution of the anodized layer of the aluminum substrate during development and the thickness preferably ranges from 0.01 to 50 µm and more preferably 0.05 to 10 µm.

The back coat layer can be formed according to various methods. For instance, the back coat layer consisting essentially of the organic polymeric compound can be formed by a method comprising the steps of dissolving or dispersing the foregoing components in a proper solvent to give a solution or emulsion, applying it onto a substrate and then drying; a method comprising laminating a film previously formed from components thereof with a substrate through the use of an adhesive or the application of heat and a method comprising forming a melt of the components into a molten film with a melt extruder and laminating the film with a substrate, but preferred are those comprising the steps of dissolving the components, applying the resulting solution onto the surface of a substrate and then drying, from the viewpoint of ensuring the coated amount defined above.

The back coat layer consisting essentially of hardened product of photo-hardening and/or heat-hardening composition can be formed by a method comprising the steps of providing the above-mentioned photo-hardening and/or heat-hardening composition, optionally dissolving or dispersing the foregoing composition in a proper solvent to give a solution or dispersion, applying the composition or the solution or dispersion onto a substrate and then drying; a method comprising laminating a film previously formed from components thereof with a substrate through the use of an adhesive or the application of heat; or a method comprising forming a melt of the components into a molten film with a melt extruder and laminating the film with a substrate, but preferred are those comprising the steps of applying the composition without a solvent or a solution of the composition onto the surface of a substrate and then drying, from the viewpoint of ensuring the coated amount defined above.

The back coat layer thus prepared is hardened by active rays, heat or both.

Solvents for the application solution of the back coat layer include ketones such as acetone, methyl ethyl ketone, methyl isobutyl ketone, cyclohexanone and diisobutyl ketone; esters such as ethyl acetate, butyl acetate, n-amyl acetate, methyl-formate, ethyl propionate, dimethyl phthalate and ethyl benzoate; aromatic hydrocarbons such as toluene, xylene, benzene and ethylbenzene; halogenated hydrocarbons such as carbon tetrachloride, trichloroethylene, chloroform, 1,1,1-trichloroethane, methylene dichloride, ethylene dichloride, monochlorobenzene and chloronaphthalene; aliphatic alcohols such as methanol, ethanol, n-propanol, isopropanol, n-butanol and t-butanol; glycol ethers and esters thereof such as tetrahydrofuran, diethyl ether, ethyleneglycol monomethylether, ethyleneglycol monoethylether, ethyleneglycol monomethylether acetate and ethyleneglycol monoethylether acetate, dimethylformamide and dimethylsulfoxide which are used alone or in combination.

The back coat layer is provided on the substrate preferably before the light-sensitive layer is provided on the substrate.

The PS plate to which the method of the present invention is applied comprises a light-sensitive layer which comprises, as light-sensitive substance, an o-quinonediazide compound, an alkali-soluble diazonium salt or the like applied onto the hydrophilic surface of a substrate. These PS plates will be explained below while a PS plate carrying a light-sensitive layer comprising an o-quinonediazide compound is taken by way of example.

Preferred examples of o-quinonediazide compounds are o-naphthoquinonediazide compounds as disclosed in, for instance, U.S. Pat. Nos. 3,046,110; 3,046,111; 3,046,112; 3,046,115; 3,046,118; 3,046,119; 3,046,120; 3,046,121; 3,046,122; 3,046,123; 3,061,430; 3,102,809; 3,106,465; 3,635,709; and 3,647,443 or other various publications and they can suitably be used in the invention.

Among these, preferred are o-naphthoquinonediazidosulfonic acid esters or o-naphthoquinonediazidocarboxylic acid esters of aromatic hydroxy compounds and o-naphthoquinonediazidosulfonic acid amides or o-naphthoquinonediazidocarboxylic acid amides of aromatic amine compounds, in particular, products of pyrogallolacetone condensate esterified with o-naphthoquinonediazidosulfonic acid as disclosed in U.S. Pat. No. 3,635,709; products obtained by esterifying polyesters having hydroxyl groups at the ends with o-naphthoquinonediazidosulfonic acid or o-naphthoquinonediazidocarboxylic acid as disclosed in U.S. Pat. No. 4,028,111; products obtained by esterifying p-hydroxystyrene homopolymers or copolymers of the monomer with other copolymerizable monomers with o-naphthoquinonediazidosulfonic acid or o-naphthoquinonediazidocarboxylic acid as disclosed in U.S. Pat. No. 1,494,043; and reaction product (amides) of copolymers of p-aminostyrene and other copolymerizable monomers with o-naphthoquinonediazidosulfonic acid or o-naphthoquinonediazidocarboxylic acid as disclosed in U.S. Pat. No. 3,759,711.

These o-quinonediazide compounds may be used alone, but are preferably used in combination with alkali-soluble resins to form light-sensitive layers. Preferred alkali-soluble resins include novolak type phenol resins and specific examples thereof are phenol-formaldehyde resins, o-cresol-formaldehyde resins and m-cresol-formaldehyde resins. It is more preferable to use the foregoing phenol resins together with condensates of phenol or cresol substituted with an alkyl group having 3 to 8 carbon atoms with formaldehyde such as t-butylphenol-formaldehyde resin as disclosed in U.S. Pat. No. 4,123,279. The alkali-soluble resin is incorporated into the light-sensitive layer in an amount ranging from about 50 to about 85% by weight and preferably 60 to 80% by weight.

The light-sensitive layer comprising an o-quinonediazide compound may optionally comprise dyes, plasticizers and/or other additives which can impart printing out properties to the light-sensitive layer.

The dyes are used for imparting a strong contrast to image areas with respect to non-image area (substrate surface) after exposing and developing a PS plate. Preferred examples thereof are alcohol-soluble dyes such as C.I. 26,105 (Oil Red RR), C.I. 21,260 (Oil Scarlet #308), C.I. 74,350 (Oil Blue), C.I. 52,015 (Methylene Blue) and C.I. 42,555 (Crystal Violet). It is sufficient to add these dyes to the light-sensitive layer in an amount such that a distinct contrast is formed between the color of the part of the remaining light-sensitive layer and that of the hydrophilic surface of a substrate revealed through exposure to light and development and it is generally suitable to add them in an amount of not more than about 7% by weight on the basis of the total weight of the light-sensitive layer.

The use of plasticizers are effective for imparting a desired flexibility to a light-sensitive layer applied onto a substrate and examples thereof effectively used include phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, dibutyl benzyl phthalate, diisodecyl phthalate and diaryl phthalate; glycol esters such as dimethyl glycol phthalate, ethyl phthalylethyl glycolate, methyl phthalylethyl glycolate, butyl phthalylbutyl glycolate and triethylene glycol caprylic acid diester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetate and butyl laurate.

The plasticizers are incorporated into the light-sensitive layer in an amount of not more than about 5% by weight on the basis of the total weight of the light-sensitive composition.

Printing out agents are agents or compositions for obtaining visible images immediately after imagewise exposing the light-sensitive layer of a PS plate. Examples of printing out agents are pH indicators as disclosed in U.K. Patent No. 1,041,463, a combination of o-naphthoquinonediazido-4-sulfonyl chloride with a dye as disclosed in U.S. Pat. No. 3,969,118, a combination of a trihalomethyl compound with a dye as disclosed in U.S. Pat. Nos. 4,160,670 and 4,239, 850, EP-A-0262788 and U.K. Patent No. 2,192,729, and photochromic compounds as disclosed in J.P. KOKOKU No. Sho 44-6413.

The light-sensitive layer may further comprise a cyclic acid anhydride for the improvement in the sensitivity thereof as described in U.S. Pat. No. 4,115,128.

The light-sensitive composition comprising these o-naphthoquinonediazide is dissolved in an appropriate solvent and the resulting solution is applied onto the surface of a substrate. Examples of suitable solvent include glycol ethers such as ethylene glycol monomethyl ether, ethylene glycol monoethyl ether and 2-methoxyethyl acetate; ketones such as acetone, methyl ethyl ketone and cyclohexanone; and chlorinated hydrocarbons such as ethylene dichloride.

The amount of the light-sensitive layer comprising an o-quinonediazide compound to be applied onto the surface of a substrate preferably ranges from about 0.5 to about 7 $g/m^2$ (weighed after drying) and more preferably 1.5 to 3 $g/m^2$.

The light-sensitive layer of a positive-working PS plate thus obtained is made alkali-soluble upon being exposed to light, through an original transparency, with light rays rich in actinic light rays from a light source such as a carbon arc lamp, a mercury lamp, a metal halide lamp, a xenon lamp or a tungsten lamp. Therefore, the exposed portion on the light-sensitive layer is dissolved out of the plate with an aqueous alkaline solution and accordingly the hydrophilic surface of the substrate is revealed.

Both the developer and replenisher used in the present invention comprise alkali metal silicates. Alkali metals of these alkali metal Silicates include sodium, potassium and lithium, but potassium is most preferred.

The developers most preferably used in the present invention are aqueous solutions of alkali metal silicates having a molar ratio, $SiO_2/M_2O$, ranging from 0.7 to 1.5 and an $SiO_2$ content ranging from 1.0 to 4.0% by weight of the aqueous solution.

The replenishers particularly preferred are aqueous solutions of alkali metal silicates having a molar ratio, $SiO_2/M_2O$, ranging from 0.3 to 1.0 and an $SiO_2$ content ranging from 0.5 to 4.0% by weight of the aqueous solution. More preferably, the molar ratio ranges from 0.3 to 0.6 and the $SiO_2$ content ranges from 0.5 to 2.0% by weight of the aqueous solution. If the molar ratio, $SiO_2/M_2O$, of the replenisher is less than 0.3, the anodized layer is excessively dissolved out of non-image portion (the portion from which the light-sensitive layer is removed through development) on the aluminum substrate and accordingly the formation of insolubles cannot be prevented. On the other hand, if it exceeds 1.0, the activity of the replenisher is lowered and correspondingly a great quantity of replenisher must be supplemented. Moreover, if the $SiO_2$ content is less than 0.5% by weight of the aqueous solution, insolubles are easily formed, while if it exceeds 4.0% by weight of the aqueous solution, a large amount of silica gel is formed during neutralization treatment of waste liquor.

The developer and replenisher used in the invention may optionally comprise an organic solvent. Examples thereof are benzyl alcohol, 2-butoxyethanol, triethanolamine, diethanolamine, monoethanolamine, glycerin, ethylene glycol, polyethylene glycol and polypropylene glycol. These organic solvents may be incorporated into the developer and/or replenisher in advance so that the amount thereof in a developer practically used during development processing is maintained at a level of not more than 5% by weight on the basis of the total weight of the developer practically used.

The developer and replenisher used in the invention may further comprise a surfactant for enhancing the processing capacity of the developer (the quantity of light-sensitive layers which can be dissolved and removed by a unit volume of a developer) and for extending the ranges of developing conditions such as temperature and processing time which can provide optimum results. The surfactants usable are anionic, amphoteric, non-ionic and cationic ones.

Examples of anionic surfactants are alkylbenzenesulfonic acid salts (the alkyl group has 8 to 18, preferably 12 to 16 carbon atoms) such as sodium dodecylbenzenesulfonate, alkylnaphthalenesulfonic acid salts (the alkyl group has 3 to 10 carbon atoms) such as sodium isopropylnaphthalenesulfonate, naphthalenesulfonic acid salt-formalin condensate, dialkylsulfosuccinic acid salts (the alkyl group has 2 to 18 carbon atoms) and dialkylamidosulfonic acid salts (the alkyl group has 11 to 17 carbon atoms).

Examples of amphoteric surfactants are imidazoline derivatives and betaine type ones such as N-alkyl-N,N,N-tris(carboxymethyl)ammonium (the alkyl group has 12 to 18 carbon atoms) and N-alkyl-N-carboxymethyl-N,N-dihydroxyethyl ammonium (the alkyl group has 12 to 18 carbon atoms).

Examples of nonionic surfactants are polyethylene glycol, polyoxyethylene lauryl ether, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glycerin monooleate, polyoxyethylene glyceryl monostearate, polyoxyethylene propylene glycol monostearate, oxyethylene oxypropylene block copolymer, phenol-polyethylene oxide adduct modified with two molecules of styrene, tribenzylphenolpolyethylene oxide adduct, octylphenol-polyoxyethylene oxypropylene adduct, glycerin monostearate, sorbitan monolaurate and polyoxyethylene sorbitan monolaurate.

Examples of cationic surfactants are polyoxyethylene alkylamine, N-alkylpropyleneamine, N-alkylpolyethylene polyamine, N-alkylpolyethylenepolyamine dimethylsulfates, alkyl biguanide, long chain amine oxide, alkylimidazoline, 1-hydroxyethyl-2-alkylimidazoline, 1-acetylaminoethyl-2-alkylimidazoline, 2-alkyl-4-methyl-4-hydroxymethyl oxazoline, long chain primary amine salt, alkyltrimethyl ammonium salt, dialkyl dimethylethyl ammonium salt, alkyl dimethyl ammonium salt, alkyl dimethylbenzyl ammonium salt, alkyl pyridinium salt, alkyl quinolinium salt, alkyl isoquinolinium salt, alkylpyridinium sulfates, stearamidomethyl pyridinium salt, acylaminoethyl diethylamine salt, acylaminoethyl methyl diethyl ammonium salt, alkylamidopropyl dimethylbenzyl ammonium salt, fatty acid polyethylene polyamide, acylaminoethyl pyridinium salt, acylcolaminoformyl methyl pyridinium salt, stearooxymethyl pyridinium salt, fatty acid triethanolamine, fatty acid triethanolamine formic acid salt, trioxyethylene fatty acid triethanolamine, fatty acid dibutylaminoethanol, acetyloxymethyl pyridinium salt and p-isooctylphenoxy ethoxyethyl dimethylbenzyl ammonium salt.

The amount of these surfactants is not limited to a specific level, but they are incorporated into the developer and/or replenisher so that the amount thereof present in the developer practically used in general ranges from about 0.003 to about 3% by weight and preferably 0.006 to 1% by weight on the basis of the total weight of the developer practically used.

The developer and replenisher used in the invention may likewise comprise an antifoaming agent. Examples of preferred antifoaming agents are compounds disclosed in, for instance, U.S. Pat. Nos. 3,250,727 and 3,545,970; U.K. Patent Nos. 1,382,901 and 1,387,713. Among these, preferred are organic silane compounds.

In the developing method of the present invention, a replenisher is supplemented in an amount sufficient for compensating components of the developer consumed in proportion to the quantity of positive-working PS plates, the developer entrained by the processed positive-working PS plates and/or alkali components neutralized with carbon dioxide in the air.

In other words, the replenisher is added to the developer in an amount sufficient for compensating components reduced due to the development of PS plates and/or reduction of them with time and/or for making up the amount entrained by the processed PS plates irrespective of the kinds of means selected for supplementing the replenisher.

For example, when the development is conducted in an automatic processor wherein a PS plate is developed while being conveyed on rollers, there may advantageously be used a method for adding a replenisher in an amount proportional to the length in the conveying direction of the PS plate which has been developed as described in British Patent No. 2046931; a method for adding a replenisher in an amount proportional to the surface of the PS plate which has been developed; or a method for intermittently adding a replenisher in an amount proportional to the time for which a pump for circulating a developing solution in the automatic processor has worked, in combination with at least one of the above methods. Further, preferred is a method for adding a replenisher wherein electrical conductivity or impedance of the developing solution is measured and the replenisher is added depending on the measured value of electrical conductivity or impedance as disclosed in U.S. Pat. No. 4,882,246 or EP-B-0107454.

The method of the present invention makes it possible to reduce the amount of the developer to be supplemented during treatment of PS plates, does not cause the formation of insolubles even when a large quantity of PS plates are processed over a long time period and can thus ensure stable developing procedures. Moreover, the back coat layer is not dissolved or damaged during the development.

The present invention will hereunder be described in more detail with reference to the following non-limitative working Examples and the effects practically achieved by the present invention will also be discussed in detail in comparison with Comparative Examples.

EXAMPLE 1 AND COMPARATIVE EXAMPLES 1 AND 2

A 0.30 mm thick aluminum plate was grained with a nylon brush and an aqueous dispersion of 400 mesh pumice stone and then thoroughly washed with water. The grained plate was etched in an aqueous 10% NaOH solution at 70° C. for 60 seconds, washed with running water, neutralized with a 20% nitric acid and washed with water. The plate was electrolytically grained in an aqueous 1% nitric acid solution using alternating current of sinusoidal wave under the conditions of Va=12.7 V and anodic electricity=160 coulomb/$dm^2$. The average surface roughness of the plate was $0.6\mu$ (expressed in Ra). The plate was then desmutted in an aqueous 30% sulfuric acid solution at 55° C. for two minutes and anodized in an aqueous 20% sulfuric acid solution at a current density of 2 $A/dm^2$ to obtain a substrate having an anodic oxide layer of 2.7 $g/m^2$.

A copolymer of allyl methacrylate and methacrylic acid (molar ratio=85/15) (30 parts by weight) as disclosed in Example 1 of U.S. Pat. No. 4,687,727, pentaerythritol tetraacrylate (20 parts by weight) and 2-trichloromethyl-5-(p-n-butoxystyryl)- 1,3,4-oxadiazole (2.4 parts by weight) were dissolved in ethyleneglycol monomethylether (100 parts by weight) and methyl ethyl ketone (100 parts by weight) to prepare a back coat solution.

The back coat solution was applied to the back surface of the substrate in an amount of 0.2 $g/m^2$ after drying and dried. The dried plate was subjected to the whole surface exposure to light from a 5 KW metal halide lamp for 10 seconds.

There were dissolved 1 part by weight of naphthoquinone- 1,2-diazido-5-sulfonic acid ester of a polyhydroxy compound obtained by polycondensing acetone and pyrogallol as described in Example 1 of U.S. Pat. No. 3,635,709, 2 parts by weight of a novolak type phenol-formaldehyde resin and 0.02 part by weight of Oil Blue #603 (available from Orient Chemical Co., Ltd.) in 20 parts by weight of 2-methoxyethyl acetate and 20 parts by weight of methyl ethyl ketone to give a light-sensitive solution.

The light-sensitive solution was applied to the grained surface of the substrate without the back coat layer and the substrate with the back coat layer each in an amount of 2.5 $g/m^2$ after drying and dried to obtain light-sensitive lithographic printing plates A and B, respectively. A large number of specimens of PS plates were prepared by cutting PS plates A and B into sheets having a size of 1310 mm×1050 mm and each sheet was imagewise exposed, through an original film, to light from a 3KW metal halide lamp at a distance of 1 m for 60 seconds.

Then a developer comprising an aqueous solution of potassium silicate having a composition as listed in Table 1 and 0.04% by weight of an amphoteric surfactant: N-alkyl-N,N-dihydroxyethyl betaine was charged in a dipping type developing bath of an automatic developing machine PS-900D (available from Fuji Photo Film Co., Ltd.) and the foregoing exposed PS plates A and B each was processed at a rate of 30 sheets/day over one month. During the processing, the reduction in the activity of the developer due to the processing of the PS plates and carbon dioxide in the air was detected by a built-in conductivity sensor of PS-900D and the replenishers each having a composition as listed in Table 1 were supplemented in accordance with the feedback system controlled by a computer to maintain the activity of the developer at a predetermined level. Evaluation of the activity was performed by exposing the PS plate using a step tablet (having 15 steps and optical density difference of 0.15) while gradually changing the quantity of light, developing the PS plate, reading the step number of images remaining on each plate in proportion to the quantity of light and comparing the step number with that observed when the processing was initiated.

TABLE 1

|  | Comp. Ex. 1 | Comp. Ex. 2 | Ex. 1 |
| --- | --- | --- | --- |
| PS plate | A | A | B |
| Composition of Developer |  |  |  |
| Ratio: $[SiO_2]/[K_2O]$ | 1.2 | 1.2 | 1.2 |
| $SiO_2$ Content (wt %) | 1.5 | 1.5 | 1.5 |
| Composition of Replenisher |  |  |  |
| Ratio: $[SiO_2]/[K_2O]$ | 1.2 | 0.45 | 0.45 |
| $SiO_2$ Content (wt %) | 3.1 | 0.98 | 0.98 |
| Averaged Amount Replenished Throughout the Running | 83 ($cc/m^2$) | 42 ($cc/m^2$) | 42 ($cc/m^2$) |
| Variation in Activity throughout the Running (steps) | ±0.5 | +2.5 | ±0.5 |
| Formation of Insolubles | a little | great, clogging of spray nozzle | none |

As seen from the results listed in Table 1, when the replenisher and the back coat layer of the present invention were used in combination, the amount of the replenisher was reduced to about ½ time, insolubles were not formed and stable processing could be ensured. Moreover, the back coat layer was not dissolved or damaged during the development.

On the other hand, in the conventional method (Comparative Example 1), insolubles were only slightly formed, but a large amount of replenisher was supplemented and this led to increases in the running cost and the amount of waste liquor to be processed. Further, the increase in only the activity of the replenisher as in Comparative Example 2 resulted in the reduction of the amount of the replenisher, but produced various troubles such as contamination of processed PS plates with insolubles, clogging of the spray nozzle, loading of filter and adhesion of white deposits to rollers, and the activity of the developer was not stable.

EXAMPLE 2 AND COMPARATIVE EXAMPLES 3 AND 4

There were dissolved 1 part by weight of naphthoquinone-1, 2-diazido-5-sulfonic acid ester of a polyhydroxy compound obtained by polycondensing acetone and pyrogallol as described in Example 1 of U.S. Pat. No. 3,635,709 and 2 parts by weight of a novolak type phenol-formaldehyde resin in 20 parts by weight of 2-methoxyethyl acetate and 20 parts by weight of methyl ethyl ketone to give a light-sensitive solution. An aluminum plate having a thickness of 0.3 mm one side of which had been grained was anodized in a sulfuric acid solution to form an anodized layer in an amount of about 3 $g/m^2$, sufficiently washed with water, then dried and the foregoing light-sensitive solution was applied onto the grained surface of the aluminum plate and dried to give a positive-working PS plate C provided with a light-sensitive layer in an amount of about 2.5 $g/m^2$ (weighed after drying). Then a solution for back coat was prepared by dissolving 0.2 part by weight of a polyurethane resin (Estane #5715 available from Monsanto Chemical Co., Ltd.) in 16 parts by weight of ethylene glycol monomethyl ether and 24 parts by weight of methyl ethyl ketone. The resulting solution for back coat was applied onto the back face of the substrate of a PS plate prepared in the same manner used for the preparation of PS plate C in an amount of 0.2 g/m² (weighed after drying) and dried to give a PS plate D. A large number of specimens of PS plates were prepared by cutting PS plates C and D into sheets having a size of 1310 mm×1050 mm and each sheet was imagewise exposed, through an original film, to light from a 3KW metal halide lamp at a distance of 1 m for 60 seconds.

Then a developer comprising an aqueous solution of potassium silicate having a composition as listed in Table 2 and 0.04% by weight of anampthoteric surfactant; N-alkyl-N,N-dihydroxyethyl betaine was charged in a dipping type developing bath of an automatic developing machine PS-900D (available from Fuji Photo Film Co., Ltd.) and the foregoing exposed PS plates C and D each was processed at a rate of 30 sheets/day over one month. During the processing, the reduction in the activity of the developer due to the processing of the PS plates and carbon dioxide in the air was detected by a built-in conductivity sensor of PS-900D and the replenishers each having a composition as listed in Table 2 was supplemented in accordance with the feedback system controlled by a computer to maintain the activity of the developer at a predetermined level. Evaluation of the activity was performed by exposing the PS plate using a step tablet (having 15 steps and optical density difference of 0.15) while gradually changing the quantity of light, developing the PS plate, reading the step number of images remaining on each plate in proportion to the quantity of light and comparing the step number with that observed when the processing was initiated.

TABLE 2

|  | Comp. Ex. 3 | Comp. Ex. 4 | Ex. 2 |
|---|---|---|---|
| PS plate | C | C | D |
| Composition of Developer | | | |
| Ratio: [SiO₂]/[K₂O] | 1.2 | 1.2 | 1.2 |
| SiO₂ Content (wt %) | 1.5 | 1.5 | 1.5 |
| Composition of Replenisher | | | |
| Ratio: [SiO₂]/[K₂O] | 1.2 | 0.45 | 0.45 |
| SiO₂ Content (wt %) | 3.1 | 0.98 | 0.98 |
| Averaged Amount Replenished Throughout the Running | 83 (cc/m²) | 42 (cc/m²) | 42 (cc/m²) |
| Variation in Activity throughout the Running (steps) | ±0.5 | +2.5 | ±0.5 |
| Formation of Insolubles | a little | great, clogging of spray nozzle | none |

As seen from the results listed in Table 2, when the replenisher and the back coat layer of the present invention were used in combination, the amount of the replenisher was reduced to about ½ time, insolubles were not formed and stable processing could be ensured. On the other hand, in the conventional method (Comparative Example 3), insolubles were only slightly formed, but a large amount of replenisher was supplemented and this led to increases in the running cost and the amount of waste liquor to be processed. Further, the increase in only the activity of the replenisher as in Comparative Example 4 resulted in the reduction of the amount of the replenisher, but produced various troubles such as contamination of processed PS plates with insolubles, clogging of the spray nozzle, loading of filter and adhesion of white deposits to rollers, and the activity of the developer was not stable.

What is claimed is:

1. A method for preparing a lithographic printing plate which comprises imagewise exposing: a presensitized plate for use in making a lithographic printing plate comprising an aluminum substrate having an anodized layer and a light-sensitive layer including an o-quinone diazide compound applied on one side of the substrate and a coating layer on the surface of the aluminum substrate opposite to the surface carrying the light-sensitive layer, said coating layer having a thickness of from 0.05 μm to 10 μm and containing an organic polymeric compound insoluble in alkaline silicate developers and being a member selected from the group consisting of polyethylene, polypropylene, polybutene, polybutadiene, polyamide, polyurethane, polyurea, polyimide, polysiloxane, polycarbonate, epoxy resin, condensed alkylphenol/aldehyde resin, acetal resin, polyvinyl chloride, polyvinylidene chloride, polystyrene, acrylic resin and copolymer resins thereof, and then developing the exposed plate with a developer comprising an aqueous solution of an alkali metal silicate, while compensating for changes in the developer due to the development of the exposed plate by supplementing, to the developer, a replenisher comprising an aqueous solution of an alkali metal silicate, wherein the replenisher is an aqueous solution of an alkali metal silicate having a ratio: $(SiO_2)/(M_2O)$ (wherein $(SiO_2)$ means molar concentration (mol/l) of $SiO_2$ and $(M_2O)$ means molar concentration (mol/l) of oxide $M_2O$ of an alkali metal (M)) ranging from 0.3 to 1.0 and an $SiO_2$ content ranging from 0.5 to 4.0% by weight of the aqueous solution.

2. The method of claim 1 wherein the replenisher is an aqueous solution of potassium silicate.

3. The method of claim 1 wherein the coating layer contains a surfactant.

4. The method of claim 3 wherein the amount of the surfactant ranges from 0.001% by weight to about 10% by weight on the basis of the weight of the coating layer.

5. The method of claim 4 wherein the amount of the surfactant ranges from 0.01 to 1% by weight on the basis of the weight of the coating layer.

6. The method of claim 1 wherein the developer is an aqueous solution of an alkali metal silicate having the molar ratio, $SiO_2/M_2O$, ranging from 0.7 to 1.5 and wherein the $SiO_2$ content ranges from 1.0 to 4.0% by weight of the aqueous solution.

7. The method of claim 1 wherein the replenisher is an aqueous solution of an alkali metal silicate having the molar ratio, $SiO_2/M_2O$, ranging from 0.3 to 0.6 and wherein the $SiO_2$ content ranges from 0.5 to 2.0% by weight of the aqueous solution.

8. The method of claim 1 wherein the developer and/or the replenisher comprise an organic solvent selected from the group consisting of benzyl alcohol, 2-butoxyethanol, triethanolamine, diethanolamine, glycerin, ethylene glycol, polyethylene glycol and polypropylene glycol.

9. The method of claim 8 wherein the amount of the organic solvent is selected so that the amount in the developer during development is maintained at a level of not more than 5% by weight on the basis of the total weight of the developer.

10. The method of claim 1 wherein the developer or replenisher further comprises a surfactant and/or an antifoaming agent.

11. The method of claim 10 wherein the amount of the surfactant ranges from 0.006 to 1% by weight on the basis of the total weight of the developer.

* * * * *